United States Patent
Takizawa

(10) Patent No.: US 11,637,052 B2
(45) Date of Patent: Apr. 25, 2023

(54) SEMICONDUCTOR DEVICE AND SEMICONDUCTOR DEVICE MANUFACTURING METHOD

(71) Applicant: FUJI ELECTRIC CO., LTD., Kawasaki (JP)

(72) Inventor: Naoki Takizawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 134 days.

(21) Appl. No.: 17/078,568

(22) Filed: Oct. 23, 2020

(65) Prior Publication Data
US 2021/0175148 A1    Jun. 10, 2021

(30) Foreign Application Priority Data
Dec. 6, 2019 (JP) .............................. JP2019-221021

(51) Int. Cl.
*H01L 23/373* (2006.01)
*H01L 25/18* (2006.01)
*H01L 21/48* (2006.01)

(52) U.S. Cl.
CPC ...... *H01L 23/3735* (2013.01); *H01L 21/4882* (2013.01); *H01L 25/18* (2013.01)

(58) Field of Classification Search
CPC ... H01L 23/375; H01L 21/4882; H01L 25/18; H01L 25/072; H01L 2924/3511; H01L 23/36; H01L 24/32; H01L 2224/32225; H01L 23/3672; H01L 23/13; H01L 23/3736; H01L 24/81; H01L 2224/81435
See application file for complete search history.

(56) References Cited

U.S. PATENT DOCUMENTS

| | | | | |
|---|---|---|---|---|
| 7,795,743 B2 * | 9/2010 | Kim | ...................... | H01L 23/562 257/772 |
| 8,018,048 B2 * | 9/2011 | Tamaki | ............... | H01L 25/0655 257/70 |
| 8,297,986 B2 * | 10/2012 | Too | ...................... | H05K 7/1061 439/70 |
| 8,472,188 B2 * | 6/2013 | Horiuchi | ............ | H05K 7/20927 165/80.4 |
| 9,627,369 B2 * | 4/2017 | Chen | ................... | H01L 25/0657 |
| 9,795,038 B2 * | 10/2017 | Karhade | ................ | H05K 3/305 |
| 9,960,109 B2 * | 5/2018 | Minegishi | ......... | H01L 23/49894 |

(Continued)

FOREIGN PATENT DOCUMENTS

| | | | | |
|---|---|---|---|---|
| CN | 105900231 A | * | 8/2016 | ........... B23K 35/262 |
| JP | H0951049 A | | 2/1997 | |

(Continued)

OTHER PUBLICATIONS

Machine Translation CN 105900231A (Year: 2016).*

*Primary Examiner* — Len Tran
*Assistant Examiner* — Gustavo A Hincapie Serna
(74) *Attorney, Agent, or Firm* — Rabin & Berdo, P.C.

(57) ABSTRACT

A semiconductor device, including a metal base plate having a front surface on which a disposition area is set apart from a central portion of the metal base plate, and a board placed over the disposition area with a solder therebetween. The solder has two edge portions of which one is closer than the other to the central portion of the metal base plate, said one being thicker than said the other.

6 Claims, 13 Drawing Sheets

(56) References Cited

U.S. PATENT DOCUMENTS

| | | | | |
|---|---|---|---|---|
| 2004/0222510 A1* | 11/2004 | Aoyagi | ................. | H05K 1/181 |
| | | | | 257/E25.023 |
| 2004/0241904 A1* | 12/2004 | Lee | ........................ | H05K 3/28 |
| | | | | 174/262 |
| 2008/0317080 A1* | 12/2008 | Kameyama | ........... | H01S 5/0207 |
| | | | | 372/44.01 |
| 2009/0014844 A1* | 1/2009 | Lee | ................ | H01L 21/823412 |
| | | | | 257/E21.409 |
| 2013/0105955 A1* | 5/2013 | Kim | ................. | H01L 23/49503 |
| | | | | 257/676 |
| 2014/0124917 A1* | 5/2014 | Lee | ..................... | G02B 6/4226 |
| | | | | 257/E23.06 |
| 2015/0003029 A1* | 1/2015 | Okada | .................. | H01L 25/105 |
| | | | | 361/783 |
| 2015/0171028 A1* | 6/2015 | Jo | ...................... | H01L 25/0657 |
| | | | | 257/713 |
| 2015/0206832 A1* | 7/2015 | Kudo | ................ | H01L 23/49816 |
| | | | | 257/676 |
| 2017/0186721 A1* | 6/2017 | Kira | ....................... | H01L 25/04 |
| 2019/0080979 A1* | 3/2019 | Tonedachi | ........ | H01L 23/49894 |
| 2019/0378810 A1* | 12/2019 | Yoshioka | ................ | H01L 24/32 |
| 2020/0365419 A1* | 11/2020 | Onishi | .................. | H01L 23/473 |

FOREIGN PATENT DOCUMENTS

| | | | | | |
|---|---|---|---|---|---|
| JP | 2006222470 | A | * | 8/2006 | ......... H01L 21/6835 |
| JP | 2007088045 | A | * | 4/2007 | |
| JP | 2007250571 | A | * | 9/2007 | |
| JP | 2008270262 | A | * | 11/2008 | |
| JP | 2008282834 | A | * | 11/2008 | ............. H01L 24/32 |
| JP | 2009016522 | A | * | 1/2009 | |
| JP | 2011216533 | A | * | 10/2011 | |
| JP | 2013021145 | A | * | 1/2013 | |
| JP | 2013157377 | A | | 8/2013 | |
| JP | 2015170826 | A | | 9/2015 | |
| TW | 200810031 | A | * | 2/2008 | ............. H01L 23/10 |

* cited by examiner

SEMICONDUCTOR DEVICE AND SEMICONDUCTOR DEVICE MANUFACTURING METHOD

CROSS-REFERENCE TO RELATED APPLICATION

This application is based upon and claims the benefit of priority of the prior Japanese Patent Application No. 2019-221021, filed on Dec. 6, 2019, the entire contents of which are incorporated herein by reference.

BACKGROUND OF THE INVENTION

1. Field of the Invention

The embodiments discussed herein relate to a semiconductor device and a semiconductor device manufacturing method.

2. Background of the Related Art

Semiconductor devices include a plurality of boards, semiconductor elements placed over each of the plurality of boards, and a metal base plate having a front surface to which the plurality of boards are bonded. Each board includes a ceramic board, a metal plate formed on the back surface of the ceramic board, and circuit patterns formed on the front surface of the ceramic board. A semiconductor element is located over a circuit pattern of such a board. A semiconductor element is a power device such as an insulated gate bipolar transistor (IGBT) or a power metal oxide semiconductor field effect transistor (MOSFET). The plurality of boards on each of which such a semiconductor element is placed are located over the metal base plate with solder therebetween. With the semiconductor devices, heat generated by a semiconductor element is transmitted from a board to the metal base plate and is dissipated. In order to improve the heat dissipation properties of the semiconductor devices, to thin the solder between the boards and the metal base plate is desired.

Japanese Laid-open Patent Publication No. 2015-170826

However, if solder in a semiconductor device is made too thin, then a cavity (shrinkage cavity) is formed inside the solder. If a shrinkage cavity is formed in the solder, then the heat conduction property of the solder deteriorates. As a result, the heat dissipation property of the semiconductor device deteriorates. This leads to deterioration in the characteristics. On the other hand, if the solder is made thick to prevent a shrinkage cavity from being formed, then it is impossible to improve the heat dissipation property.

SUMMARY OF THE INVENTION

According to an aspect, there is provided a semiconductor device including a metal base plate having a front surface on which a disposition area is set apart from a central portion of the metal base plate; and a board placed over the disposition area with a solder therebetween, the solder having two edge portions of which one is closer than the other to the central portion of the metal base plate, said one being thicker than said other.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described by reference to the accompanying drawings. In the following description a "front surface" or an "upper surface" indicates a surface of a semiconductor device 10 of FIG. 2 which faces upward. Similarly, an "upside" indicates the upper side of the semiconductor device 10 of FIG. 2. A "back surface" or a "lower surface" indicates a surface of the semiconductor device 10 of FIG. 2 which faces downward. Similarly, a "downside" indicates the lower side of the semiconductor device 10 of FIG. 2. These terms mean the same directions at need in the other drawings. The "front surface," the "upper surface," the "upside," the "back surface," the "lower surface," the "downside," and a "side" are simply used as expedient representation for specifying relative positional relationships and do not limit the technical idea of the present disclosure. For example, the "upside" or the "downside" does not always mean the vertical direction relative to the ground. That is to say, a direction indicated by the "upside" or the "downside" is not limited to the gravity direction.

First Embodiment

Figure 1:
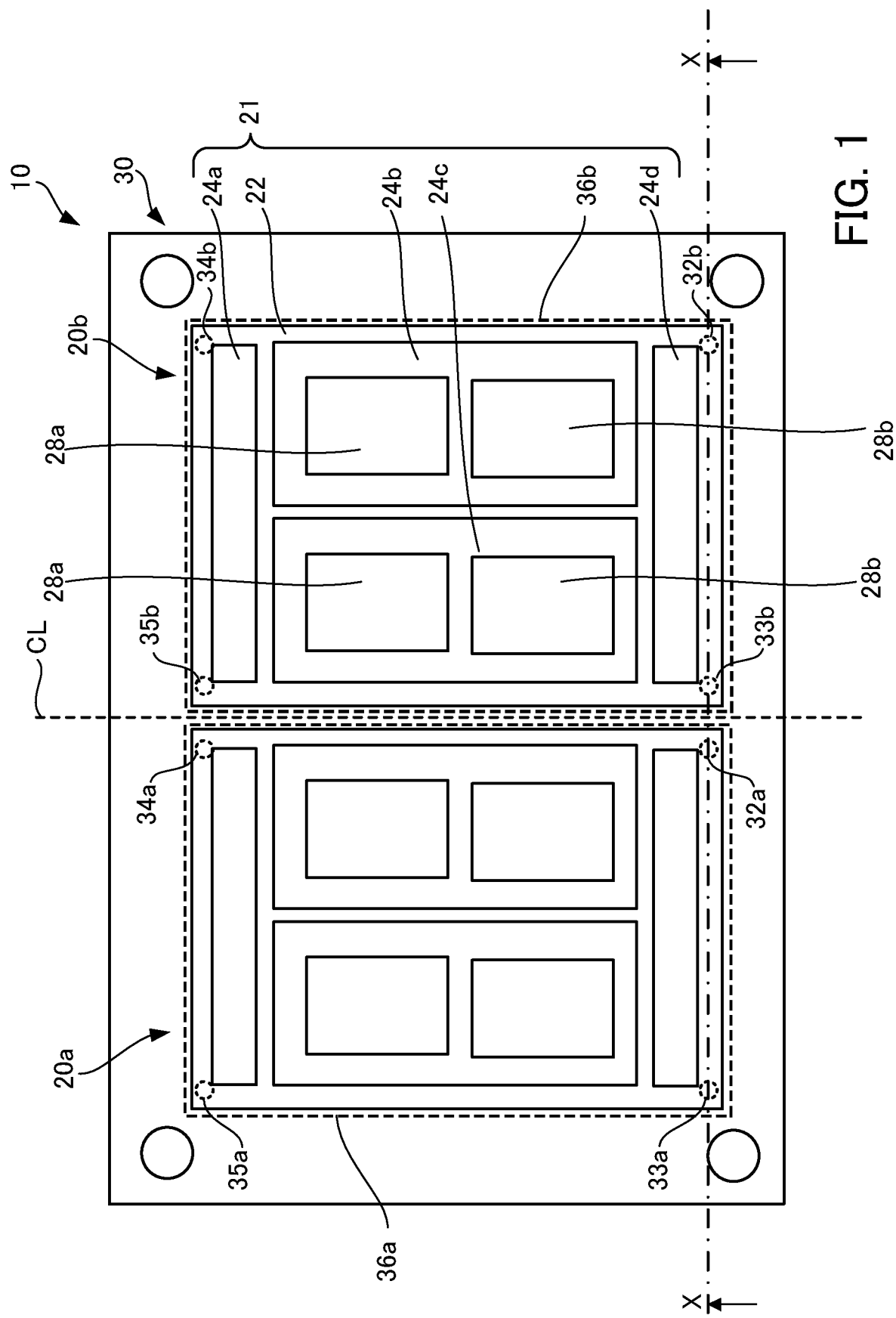
FIG. 1 is a plan view of a semiconductor device according to a first embodiment.
Figure 2:
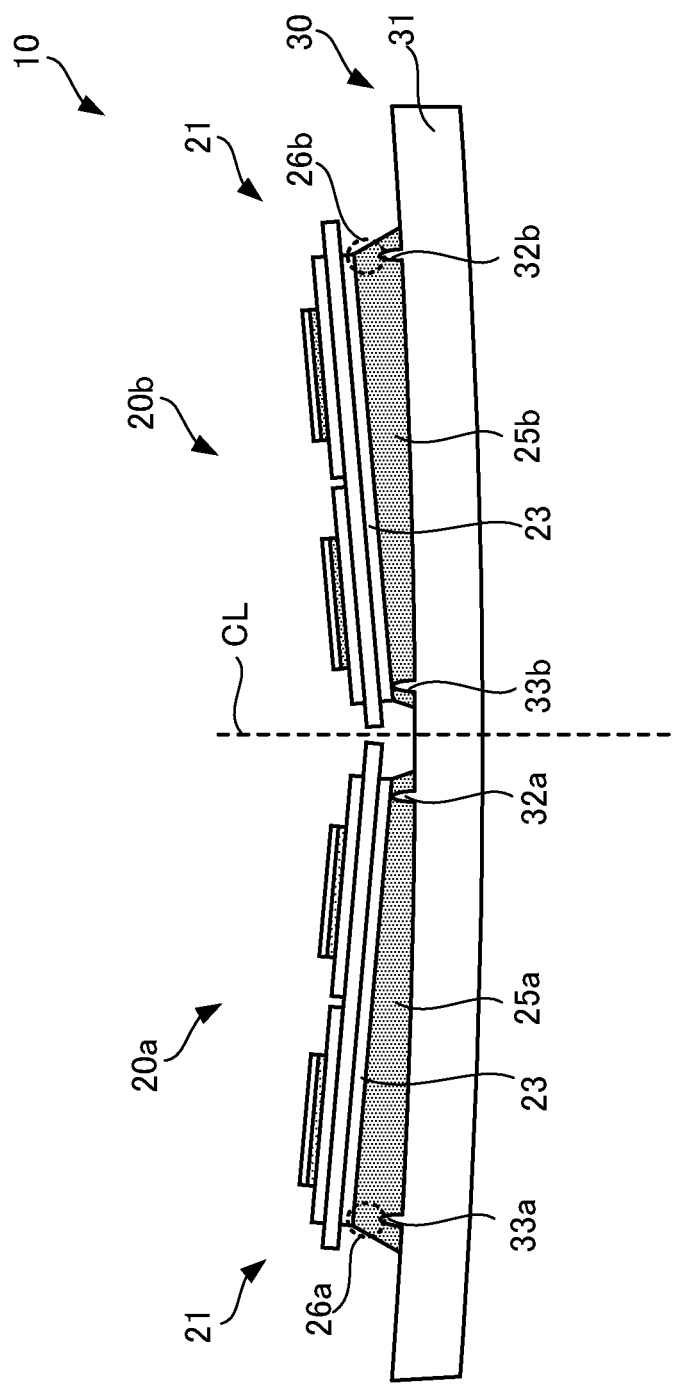
FIG. 2 is a sectional view of the semiconductor device according to the first embodiment.

A semiconductor device according to a first embodiment will be described with reference to FIG. 1 and FIG. 2. FIG. 1 is a plan view of a semiconductor device according to a first embodiment. FIG. 2 is a sectional view of the semiconductor device according to the first embodiment. In FIG. 1, positions at which protrusions 32a through 35a and protrusions 32b through 35b are formed are indicated by dashed lines. FIG. 2 is a sectional view taken along the dot-dash line X-X of FIG. 1.

A semiconductor device 10 includes two semiconductor units 20a and 20b and a metal base plate 30 over which the two semiconductor units 20a and 20b are located with solder 25a and solder 25b, respectively, therebetween. Hereinafter the semiconductor units 20a and 20b will be described as the semiconductor units 20 if no special distinction is made between the semiconductor units 20a and 20b.

Each semiconductor unit 20 includes a ceramic circuit board 21 and semiconductor chips 28a and 28b placed over the ceramic circuit board 21 with solder therebetween. The ceramic circuit board 21 is rectangular in plan view. The ceramic circuit board 21 includes an insulating plate 22, a metal plate 23 placed on the back surface of the insulating plate 22, and circuit patterns 24a through 24d placed on the front surface of the insulating plate 22. The insulating plate 22 and the metal plate 23 are rectangular in plan view. Furthermore, each corner portion of them may be R-chamfered or C-chamfered. The size of the metal plate 23 is smaller than that of the insulating plate 22 in plan view. The metal plate 23 is formed inside the insulating plate 22. The insulating plate 22 is made of a ceramic, such as aluminum oxide, aluminum nitride, or silicon nitride, having high thermal conductivity. The metal plate 23 is made of metal, such as aluminum, iron, silver, copper, or an alloy containing at least one of them, having high thermal conductivity. In addition, the thickness of the metal plate 23 is greater than or equal to 0.1 mm and smaller than or equal to 2.0 mm. In order to improve corrosion resistance, plating treatment may be performed on the surface of the metal plate 23. At this time, nickel, a nickel-phosphorus alloy, a nickel-boron alloy, or the like is used as a plating material. The circuit patterns 24a through 24d are made of metal, such as silver, copper, nickel, or an alloy containing at least one of them, having good electrical conductivity. In addition, the thickness of the circuit patterns 24a through 24d is greater than or equal to 0.5 mm and smaller than or equal to 1.5 mm. In order to improve corrosion resistance, plating treatment may be performed on the surfaces of the circuit patterns 24a through 24d. At this time, nickel, a nickel-phosphorus alloy, a nickel-boron alloy, or the like is used as a plating material. The circuit patterns 24a through 24d are obtained by forming a metal layer on the front surface of the insulating plate 22 and performing treatment, such as etching, on the metal layer. Alternatively, the circuit patterns 24a through 24d cut in advance from a metal layer may be pressure-bonded to the front surface of the insulating plate 22. The circuit patterns 24a through 24d illustrated in FIG. 1 are taken as an example. The number, shape, size, or the like of circuit patterns may be properly selected at need. A direct copper bonding (DCB) board, an active metal brazed (AMB) board, or the like may be used as the ceramic circuit board 21 made up of these parts.

A semiconductor chip 28a includes a switching element such as an IGBT or a power MOSFET. If the semiconductor chip 28a includes an IGBT, then it has a collector electrode as a main electrode on the back surface and has a gate electrode and an emitter electrode as a main electrode on the front surface. If the semiconductor chip 28a includes a power MOSFET, then it has a drain electrode as a main electrode on the back surface and has a gate electrode and a source electrode as a main electrode on the front surface. The back surfaces of the above semiconductor chips 28a are bonded to the circuit patterns 24b and 24c with solder (not illustrated). Wiring members are properly connected to the main electrodes and the gate electrodes on the front surfaces of the semiconductor chips 28a electrically and mechanically. At this time, bonding wires, lead frames, members in the shape of a pin or ribbon, or the like are used as the wiring members.

Furthermore, a semiconductor chip 28b includes a diode. This diode is a freewheeling diode (FWD) such as a Schottky barrier diode (SBD) or a P-intrinsic-N (PiN) diode. This semiconductor chip 28b has an output electrode (cathode electrode) as a main electrode on the back surface and has an input electrode (anode electrode) as a main electrode on the front surface. The back surfaces of the above semiconductor chips 28b are bonded to the circuit patterns 24b and 24c with solder (not illustrated). Wiring members are also properly connected to the main electrodes on the front surfaces of the semiconductor chips 28b electrically and mechanically. At this time, bonding wires, lead frames, members in the shape of a pin or ribbon, or the like are used as the wiring members. A reverse-conducting (RC)-IGBT having the function of an IGBT and the function of an FWD may be used in place of the semiconductor chips 28a and 28b. Moreover, FIG. 1 simply illustrates a case where the two sets of semiconductor chips 28a and 28b are included. However, the number of sets of semiconductor chips 28a and 28b is not limited to two. Sets of semiconductor chips 28a and 28b corresponding to the specifications and the like of the semiconductor device 10 may be included. Furthermore, electronic parts may be arranged over the circuit patterns 24b and 24c at need according to the specifications and the like of the semiconductor device 10. The needed number of electronic parts are bonded to the circuit patterns 24b and 24c with solder therebetween. Electronic parts are properly selected so that the semiconductor device 10 will carry out desired functions. Such electronic parts are a control integrated circuit (IC), a thermistor, a condenser, a resistor, and the like.

Pb-free solder is used as solder with which the semiconductor chips 28a and 28b are bonded to the circuit patterns 24b and 24c. Pb-free solder contains at least one of a tin-silver-copper alloy, a tin-zinc-bismuth alloy, a tin-copper alloy, a tin-silver-indium-bismuth alloy, and the like as a main ingredient. Furthermore, the solder may contain an additive such as nickel, germanium, cobalt, or silicon. If the solder contains an additive, then wettability, gloss, and bonding strength are improved. As a result, reliability is improved.

The metal base plate 30 is made of metal, such as aluminum, iron, silver, copper, or an alloy containing at least one of them, having high thermal conductivity. Furthermore, in order to improve corrosion resistance, plating treatment may be performed on the surface of the metal base plate 30. At this time, nickel, a nickel-phosphorus alloy, a nickel-boron alloy, or the like is used as a plating material. In addition, the thermal expansion coefficient of the metal base plate 30 is greater than that of the ceramic circuit board 21. The metal base plate 30 may be rectangular in plan view. Moreover, each corner portion of the metal base plate 30 may be R-chamfered or C-chamfered. The metal base plate 30 includes a radiation plate 31 and the protrusions 32a through 35a and 32b through 35b formed on the front surface of the radiation plate 31. The radiation plate 31 included in the metal base plate 30 has the shape of a flat plate. As illustrated in FIG. 2, the radiation plate is warped and downward convex. That is to say, the short sides and the long sides of the radiation plate 31 are warped above a central portion so that the central portion will be below them. As described later, this is caused by heating performed in a process for manufacturing the semiconductor device 10. The average thickness of the whole of the radiation plate 31 is greater than or equal to 1 mm and smaller than or equal to 10 mm. Furthermore, disposition areas 36a and 36b are set on the radiation plate 31 so as to be symmetrical with the central portion as a center. As described later, the semiconductor units 20a and 20b are disposed on the disposition areas 36a and 36b respectively. The metal base plate 30 (radiation plate 31) is warped and downward convex so that the central portion will be below each side. Accordingly, the disposition area 36a or 36b is not set on the central portion of the radiation plate 31. The disposition areas 36a and 36b are set so as to be symmetrical with a centerline CL of the radiation plate 31 therebetween. To be concrete, in the case of FIG. 1, the disposition areas 36a and 36b are set on the left side and the right side, respectively, of the radiation plate 31 with the centerline CL passing through the central portion of the radiation plate 31 and parallel to the lateral direction therebetween. For example, a fixing hole is made at need in a corner portion of the radiation plate 31. By inserting a screw into each fixing hole, the metal base plate 30 is fixed to a determined place and a cooler described later is fixed.

Furthermore, with the metal base plate 30, the protrusions 32a through 35a and 32b through 35b and the radiation plate 31 are integrally formed. The protrusions 32a through 35a and 32b through 35b are formed on corner portions of the disposition areas 36a and 36b, respectively, of the radiation plate 31. The disposition areas 36a and 36b of the radiation plate 31 may be opposed to the semiconductor units 20a and 20b respectively. That is to say, the disposition areas 36a and 36b of the radiation plate 31 may be opposed to the back surfaces of the metal plates 23 of the ceramic circuit boards 21. Accordingly, the protrusions 32a through 35a and 32b through 35b may be opposed to corner portions of the semiconductor units 20a and 20b respectively. In addition, the protrusions 32a through 35a and 32b through 35b may be opposed to corner portions of the back surfaces of the metal plates 23 of the ceramic circuit boards 21. In the first embodiment, the protrusions 32a through 35a and 32b through 35b are equal in height. The height of the protrusions 32a through 35a and 32b through 35b is, for example, is greater than or equal to 0.05 mm and smaller than or equal to 0.5 mm. Moreover, the diameter of the protrusions 32a through 35a and 32b through 35b is, for example, greater than or equal to 50 μm and smaller than or equal to 500 μm. Furthermore, in FIG. 2, the protrusions 32a through 35a and 32b through 35b have the shape of a pole. However, the protrusions 32a through 35a and 32b through 35b may have another shape. For example, the protrusions 32a through 35a and 32b through 35b may have the shape of a hemisphere, a half-ellipsoid, or a cube. In addition, the protrusions 32a and 34a may be linked to form a convex shape along a side of the ceramic circuit board 21. Similarly, the protrusions 33b and 35b, the protrusions 33a and 35a, or the protrusions 32b and 34b may be linked to form a convex shape along a side of the ceramic circuit board 21.

A cooler (not illustrated) may be fixed to the back surface of the above metal base plate 30 with solder, silver solder, or the like therebetween. At this time, the cooler is fastened to the metal base plate 30 by inserting screws into the fixing holes of the metal base plate 30. This improves the heat dissipation property of the metal base plate 30. For example, this cooler is made of metal, such as aluminum, iron, silver, copper, or an alloy containing at least one of them, having high thermal conductivity. Moreover, a fin, a heat sink made up of a plurality of fins, a water-cooling cooler, or the like may be used as the cooler. In addition, the metal base plate 30 and the cooler may be integrally formed. In that case, the metal base plate 30 and the cooler are also made of metal, such as aluminum, iron, silver, copper, or an alloy containing at least one of them, having high thermal conductivity. Moreover, in order to improve corrosion resistance, plating treatment may be performed on the surface of the cooler integrally formed with the metal base plate 30. At this time, nickel, a nickel-phosphorus alloy, a nickel-boron alloy, or the like is used as a plating material.

The semiconductor units 20a and 20b are placed over the disposition areas 36a and 36b of the metal base plate 30 with the solder 25a and the solder 25b, respectively, therebetween. As illustrated in FIG. 2, at this time, each of the solder 25a and the solder 25b is formed between the front surface of the metal base plate and the back surface of the metal plate 23 of the ceramic circuit boards 21. As a result, the front surface of the metal base plate 30 and the back surface of the metal plate 23 of the ceramic circuit boards 21 are bonded together. With the solder 25a and the solder 25b, a fillet having a shape which smoothly widens from an edge portion of the metal plate 23 to the outside is formed.

Furthermore, as illustrated in FIG. 2, the thickness of edge portions of the solder 25a and the solder 25b distant from the centerline CL (central portion) of the metal base plate 30 is greater than that of edge portions of the solder 25a and the solder 25b near to the centerline CL. It is desirable that the thickness of the edge portions of the solder 25a and the solder 25b distant from the centerline CL (central portion) of the metal base plate 30 be greater than that of the edge portions of the solder 25a and the solder 25b near to the centerline CL by 10 percent or more and 400 percent or less. For example, the thickness of the edge portions of the solder 25a and the solder 25b distant from the centerline CL (central portion) is 0.40 mm and the thickness of the edge portions of the solder 25a and the solder 25b near to the centerline CL is 0.25 mm. The thickness of edge portions of the solder 25a and the solder 25b may be the thickness of the solder 25a and the solder 25b formed between the back surfaces of end portions of the metal plates 23 of the ceramic circuit boards 21 and the front surface of the radiation plate 31 except the protrusions 32a through 35a and 32b through 35b of the metal base plate 30. As the distance from the centerline CL of the metal base plate 30 increases, the solder 25a and the solder 25b may become thicker. Moreover, between the edge portion of the solder 25a or the solder 25b near to the centerline CL and the edge portion of the solder 25a or the solder 25b distant from the centerline CL, there may be a portion which is thinner than the edge portion distant from the centerline CL according to a warp of the metal base plate 30.

Furthermore, the tip portions of the protrusions 32a and 34a and the protrusions 33b and 35b near to the centerline CL of the metal base plate 30 are in contact with the back surfaces of the semiconductor units 20a and 20b respectively. On the other hand, all the portions including the tip portions of the protrusions 33a and 35a and the protrusions 32b and 34b distant from the centerline CL are separated from the back surfaces of the semiconductor units 20a and 20b respectively. There are gaps 26a and 26b between them. FIG. 2 simply illustrates the protrusions 32a and 33a and the protrusions 32b and 33b. The same applies to the protrusions 34a and 35a and the protrusions 34b and 35b. That is to say, the semiconductor units 20a and 20b are inclined so that edge portions of the semiconductor units 20a and 20b near to the centerline CL of the metal base plate 30 will be lower than edge portions of the semiconductor units 20a and 20b distant from the centerline CL. The semiconductor units 20a and 20b are bonded in this state with the solder 25a and the solder 25b respectively. Accordingly, end portions of the solder 25a and the solder 25b distant from the centerline CL (central portion) of the metal base plate 30 are thicker than end portions of the solder 25a and the solder 25b near to the centerline CL. In addition, the amount of the end portions distant from the centerline CL (central portion) of the solder 25a and the solder 25b which project from the end portions of the metal plates 23 on the front surface of the metal base plate 30 is larger than the amount of the end portions near to the centerline CL of the solder 25a and the solder 25b which project from the end portions of the metal plate 23. Accordingly, fillets of the end portions of the solder 25a and the solder 25b distant from the centerline CL of the metal base plate 30 are greater than fillets of the end portions of the solder 25a and the solder 25b near to the centerline CL.

In the first embodiment, the semiconductor device 10 may be sealed with sealing resin (not illustrated). In this case, a sealing member contains a thermosetting resin, such as epoxy resin, phenolic resin, or maleimide resin, and a filler contained in a thermosetting resin. Epoxy resin containing a filler is an example of a sealing member. An inorganic filler is used as a filler. Silicon oxide, aluminum oxide, boron nitride, or aluminum nitride is an example of an inorganic filler.

Figure 3:
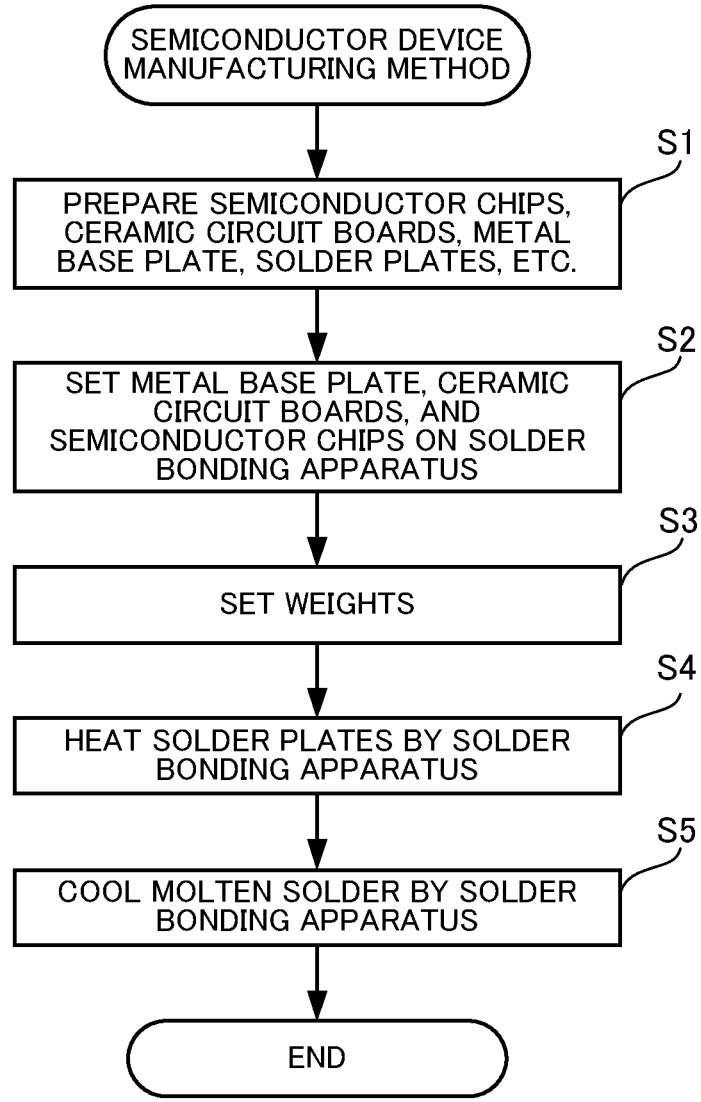
FIG. 3 is a flow chart illustrative of a method for manufacturing the first semiconductor device.
Figure 4:
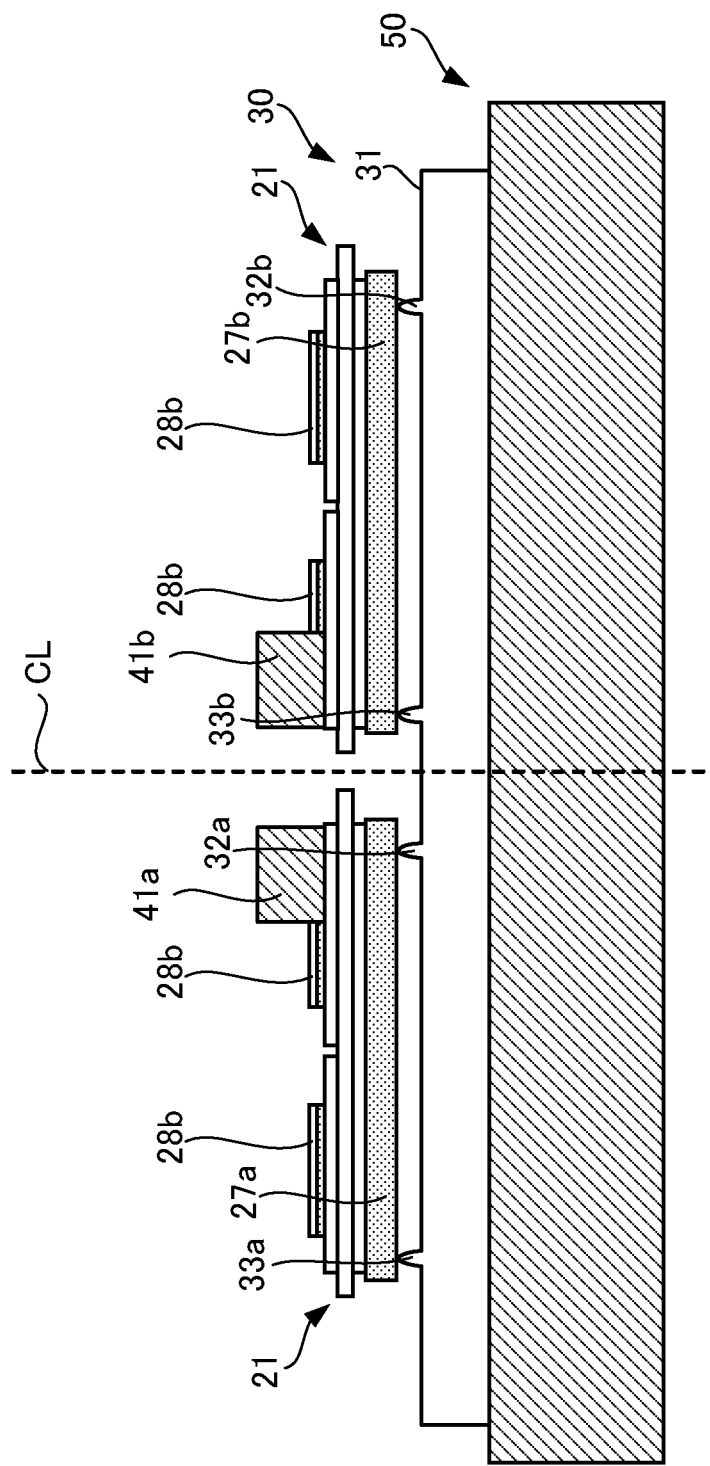
FIG. 4 is a view for describing setting on a solder bonding apparatus in the method for manufacturing the first semiconductor device.
Figure 5:
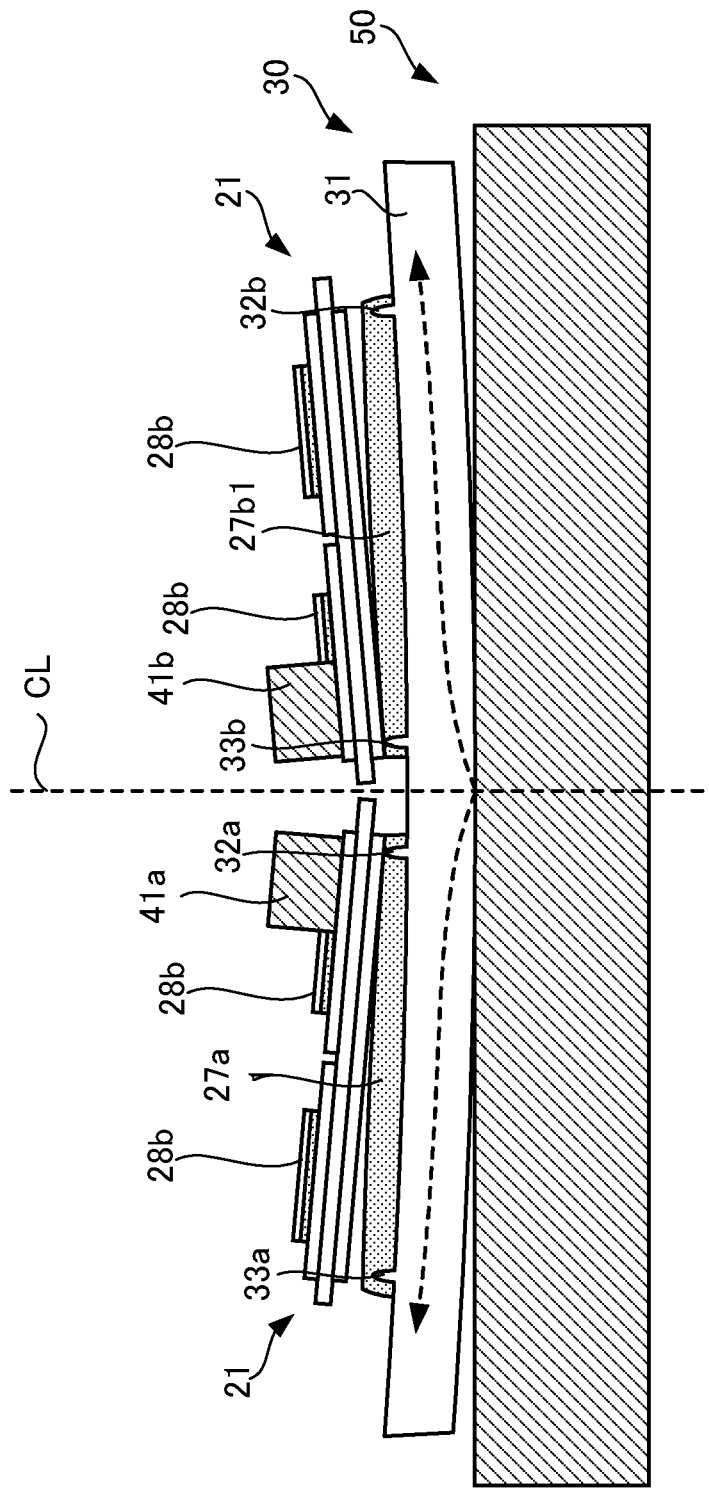
FIG. 5 is a view for describing heating in the solder bonding apparatus in the method for manufacturing the first semiconductor device.
Figure 6:
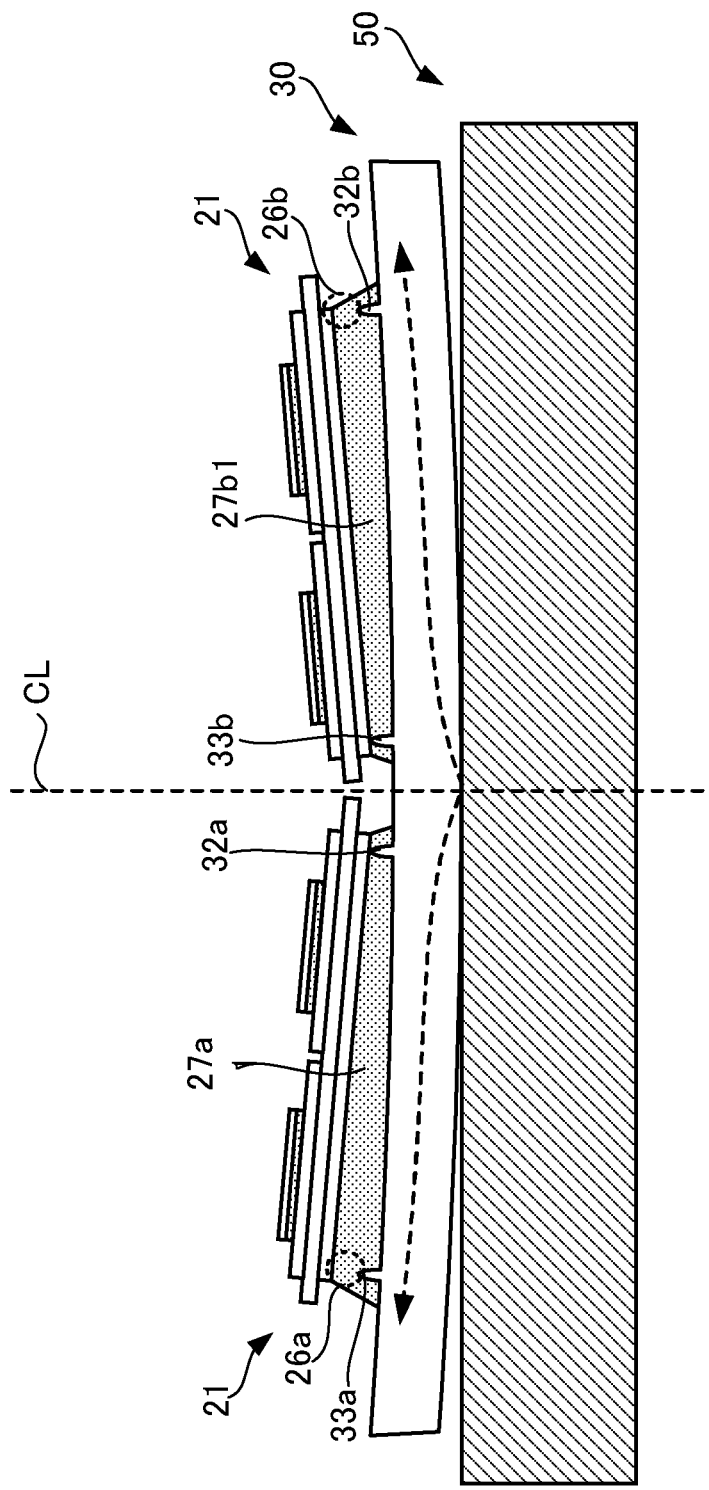
FIG. 6 is a view for describing cooling in the solder bonding apparatus in the method for manufacturing the first semiconductor device.

A method for manufacturing the above semiconductor device 10 will now be described with reference to FIGS. 3 through 6. FIG. 3 is a flow chart illustrative of a method for manufacturing the first semiconductor device. FIG. 4 is a view for describing setting on a solder bonding apparatus in the method for manufacturing the first semiconductor device. FIG. 5 is a view for describing heating in the solder bonding apparatus in the method for manufacturing the first semiconductor device. FIG. 6 is a view for describing cooling in the solder bonding apparatus in the method for manufacturing the first semiconductor device. FIGS. 4 through 6 are sectional view taken along the dot-dash line X-X of FIG. 1.

First components, such as the semiconductor chips 28a and 28b, the ceramic circuit boards 21, the metal base plate 30, and solder plates, of the semiconductor device 10 are prepared (step S1). The protrusions 32a through 35a and the protrusions 32b through 35b are formed in advance on the disposition areas 36a and 36b, respectively, set on the metal base plate 30.

Next, the metal base plate 30 is set on a determined area of a solder bonding apparatus 50. A central portion of the metal base plate 30 may be slightly warped and upward convex. That is to say, the central portion of the metal base plate 30 may protrude above the short sides and the long sides of the metal base plate 30 and be warped. Solder plates 27a and 27b are set so as to be supported on the protrusions 32a through 35a and the protrusions 32b through 35b formed on the disposition areas 36a and 36b, respectively, of the metal base plate 30. The solder plates 27a and 27b have the shape of a plate and are equal in composition to the above solder 25a and 25b. Furthermore, the size of the solder plates 27a and 27b is such that corner portions of the solder plates 27a and 27b are supported on the protrusions 32a through 35a and the protrusions 32b through 35b, respectively, in plan view. Moreover, the thickness of the solder plates 27a and 27b is approximately the same as the height of the protrusions 32a through 35a and the protrusions 32b through 35b or is greater than the height of the protrusions 32a through 35a and the protrusions 32b through 35b by several percent. The ceramic circuit boards 21 are set on the solder plates 27a and 27b and the semiconductor chips 28a and 28b are set on the circuit patterns 24b and 24c of the ceramic circuit boards 21 with solder plates (not illustrated) therebetween (step S2). These solder plates and the solder plates 27a and 27b are equal in kind. In addition, a jig which is capable of being aligned with the disposition areas 36a and 36b of the metal base plate 30 is used in step S2. This jig has the shape of a flat plate and its size is the same as that of the metal base plate 30 in plan view. Opening portions are formed in areas of the jig corresponding to the disposition areas 36a and 36b and are a size larger than the disposition areas 36a and 36b. Furthermore, the jig is made of a material, such as a composite ceramic material or carbon, having high thermal resistance. The solder plates 27a and 27b, the ceramic circuit boards 21, the solder plates, and the semiconductor chips 28a and 28b are set in the opening portions of the jig set on the metal base plate 30.

Next, as illustrated in FIG. 4, weights 41a and 41b are set on the ceramic circuit boards 21 on the sides of the centerline CL of the metal base plate 30 (step S3). For example, the weights 41a and 41b are rectangular in planar shape. The weights 41a and 41b are placed on outer edge portions of the ceramic circuit boards 21 along sides of the ceramic circuit boards 21 opposite each other. For example, it is desirable that the weights 41a and 41b be situated over the protrusions 32a and 34a and the protrusions 33b and 35b, respectively, in side view. The weights 41a and 41b are also made of a material, such as a composite ceramic material or carbon, having high thermal resistance.

Next, the solder bonding apparatus 50 is driven and the solder plates 27a and 27b are heated via the metal base plate 30 (step S4). Heat generated by the solder bonding apparatus 50 is conducted to the back surface of the metal base plate 30. When the metal base plate 30 is heated, the metal base plate 30 warps, so that its central portion is downward convex. That is to say, the metal base plate 30 warps so that its short sides and long sides will be above its central portion. Accordingly, the central portion of the back surface of the metal base plate 30 is heated by the solder bonding apparatus 50. The heat is conducted along arrows indicated by dashed lines in FIG. 5 from the central portion (centerline CL) of the back surface of the metal base plate 30 to outer edge portions of the metal base plate 30 (radiation plate 31). The heat is conducted via the radiation plate 31 to the protrusions 32a through 35a and the protrusions 32b through 35b. Furthermore, the solder plates 27a and 27b supported on the protrusions 32a through 35a and the protrusions 32b through 35b, respectively, are heated and melted into molten solder 27a1 and molten solder 27b1. The molten solder 27a1 and the molten solder 27b1 are pressed against the disposition areas 36a and 36b, respectively, by the ceramic circuit boards 21. At this time, the ceramic circuit boards 21 are pressed toward the disposition areas 36a and 36b by the weights 41a and 41b. As a result, edge portions of the ceramic circuit boards 21 distant from the centerline CL go into a floating state. As illustrated in FIG. 6, edge portions distant from the centerline CL of the metal base plate 30 of the molten solder 27a1 and the molten solder 27b1 into which the solder plates 27a and 27b are completely melted in this state are thicker than edge portions near to the centerline CL of the metal base plate 30 of the molten solder 27a1 and the molten solder 27b1. The protrusions 32a through 35a and the protrusions 32b through 35b have the shape of a pole. Accordingly, the molten solder 27a1 and the molten solder 27b1 into which the solder plates 27a and 27b are melted are apt to descend to the sides of the disposition areas 36a and 36b along the protrusions 32a through 35a and the protrusions 32b through 35b respectively. In addition, the protrusions 32a through 35a and the protrusions 32b through 35b have the shape of a pole and are formed on corner portions of the disposition areas 36a and 36b respectively. This hardly prevents the molten solder 27a1 and the molten solder 27b1 from spreading on the disposition areas 36a and 36b. Moreover, at least tip portions of the protrusions 32a and 34a and the protrusions 33b and 35b near to the centerline CL of the metal base plate 30 are in contact with the back surfaces of the semiconductor units 20a and 20b respectively. On the other hand, all the portions including the tip portions of the protrusions 33a and 35a and the protrusions 32b and 34b distant from the centerline CL are separated from the back surfaces of the semiconductor units 20a and 20b respectively. The gaps 26a and 26b are formed between them. Furthermore, for example, a resist member may be applied to the outside of sides distant from the centerline CL of the disposition areas 36a and 36b parallel to the centerline CL so that the molten solder 27a1 and the molten solder 27b1 will have shapes illustrated in FIG. 6 by pressing the ceramic circuit boards 21 with the weights 41a and 41b. The resist member prevents the molten solder 27a1 and the molten solder 27b1 from flowing from the centerline CL to the outside. As a result, the edge portions distant from the centerline CL of the metal base plate 30 of the molten solder 27a1 and the molten solder 27b1 are reliably thicker than the edge portions near to the centerline CL of the molten solder 27a1 and the molten solder 27b1.

Next, the solder bonding apparatus 50 is stopped and the molten solder 27a1 and the molten solder 27b1 are cooled (step S5). When the generation of heat by the solder bonding apparatus 50 is stopped, the metal base plate 30 (radiation plate 31) is cooled along arrows indicated by dashed lines in FIG. 6 from the central portion (centerline CL) to the outer edge portions of the metal base plate 30 (radiation plate 31). As a result, the molten solder 27a1 and the molten solder 27b1 are also cooled from the centerline CL to the outside. In the molten solder 27a1 and the molten solder 27b1 cooled in this way, outer areas cooled last cohere and their volume shrinks. As the outer areas of the molten solder 27a1 and the molten solder 27b1 shrink at this time, their peripheral volume coheres further to compensate for a shrinkage in the volume. If at this time there is no sufficient volume for compensating for a shrinkage in the volume, then there appears space and a shrinkage cavity is formed. In the first embodiment, however, the edge portions distant from the centerline CL of the metal base plate 30 of the molten solder 27a1 and the molten solder 27b1 are thicker than the edge portions near to the centerline CL of the molten solder 27a1 and the molten solder 27b1, as illustrated in FIG. 6. Accordingly, as the outer areas of the molten solder 27a1 and the molten solder 27b1 shrink, they are able to compensate for a shrinkage in the volume. This prevents a shrinkage cavity from being formed. The molten solder 27a1 and the molten solder 27b1 are cooled in this way and are solidified to form the solder 25a and the solder 25b respectively. As a result, the semiconductor units 20a and 20b are bonded to the metal base plate 30 with the solder 25a and the solder 25b, respectively, and the semiconductor device 10 is manufactured. The semiconductor device 10 illustrated in FIG. 2 is obtained by taking the semiconductor device 10 manufactured in this way out of the solder bonding apparatus 50. With the flow chart of FIG. 3, the weights 41a and 41b are used for inclining the ceramic circuit boards 21. However, another case is possible. When the solder plates 27a and 27b are melted, parts or a jig having the function of pressing portions near to the centerline CL of the ceramic circuit boards 21 may be used.

As stated above, with the semiconductor device 10, the ceramic circuit boards 21 are located over the disposition areas 36a and 36b of the metal base plate 30 with the solder plates 27a and 27b, respectively, therebetween. The solder plates 27a and 27b are melted while portions near to the centerline CL of the metal base plate 30 of the front surfaces of the ceramic circuit boards 21 are being pressed toward the metal base plate 30. By doing so, the ceramic circuit boards 21 are bonded to the disposition areas 36a and 36b. The solder plates 27a and 27b are melted while the portions near to the centerline CL of the metal base plate 30 of the front surfaces of the ceramic circuit boards 21 are being pressed toward the metal base plate 30. By doing so, the edge portions distant from the centerline CL of the molten solder 27a1 and the molten solder 27b1 become thicker than the edge portions near to the centerline CL of the molten solder 27a1 and the molten solder 27b1. Accordingly, as the outer areas of the molten solder 27a1 and the molten solder 27b1 shrink, they are able to compensate for a shrinkage in the volume. This suppresses the formation of a shrinkage cavity.

The semiconductor device 10 manufactured in this way includes the metal base plate 30 on whose front surface the disposition areas 36a and 36b are set apart from the centerline CL and the ceramic circuit boards 21 located over the disposition areas 36a and 36b with the solder 25a and the solder 25b, respectively, therebetween. In this case, the edge portions distant from the centerline CL of the solder 25a and the solder 25b are thicker than the edge portions near to the centerline CL of the solder 25a and the solder 25b. The formation of a shrinkage cavity is suppressed in outer areas of the solder 25a and the solder 25b. This manufacturing method suppresses an increase in the amount of the solder 25a and the solder 25b and an increase in the thermal resistance of the solder 25a and the solder 25b and prevents deterioration in the heat dissipation property of the semiconductor device 10. Accordingly, with the semiconductor device 10, deterioration in reliability is suppressed and stable operation is realized.

Second Embodiment

Figure 7:
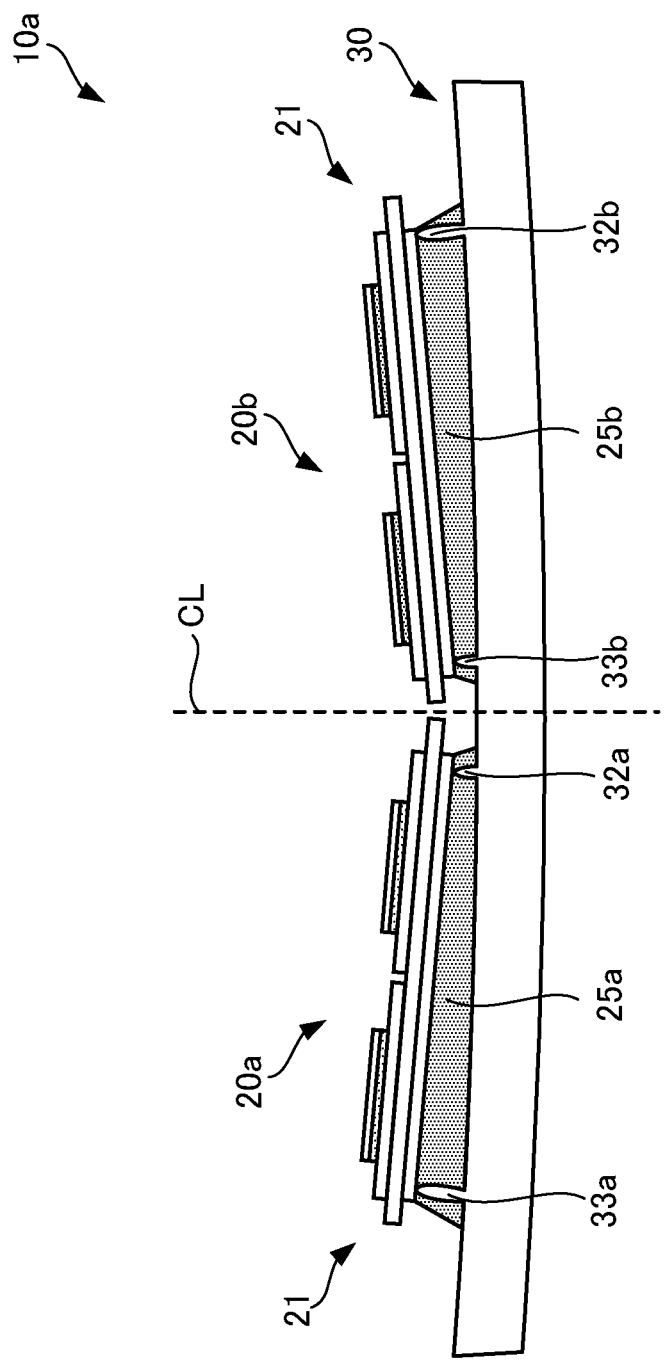
FIG. 7 is a sectional view of a semiconductor device according to a second embodiment.

A semiconductor device 10a according to a second embodiment will be described with reference to FIG. 7. FIG. 7 is a sectional view of a semiconductor device according to a second embodiment. FIG. 7 is a sectional view of a portion corresponding to the dot-dash line X-X of FIG. 1. Furthermore, the semiconductor device 10a is the same as the semiconductor device 10 illustrated in FIG. in plan view. In addition, components of the semiconductor device 10a which are the same as those of the semiconductor device 10 according to the first embodiment are marked with the same reference numerals and detailed descriptions of them will be simplified or omitted.

With protrusions 32a through 35a and protrusions 32b through 35b formed on disposition areas 36a and 36b, respectively, of a metal base plate 30 of the semiconductor device 10a, the height of the protrusions 33a and 35a and the protrusions 32b and 34b distant from a centerline CL is greater than that of the protrusions 32a and 34a and the protrusions 33b and 35b near to the centerline CL. The height of the protrusions 33a and 35a and the protrusions 32b and 34b is greater than that of the protrusions 32a and 34a and the protrusions 33b and 35b by 50 percent or more and 400 percent or less. For example, the height of the protrusions 33a and 35a and the protrusions 32b and 34b is 0.35 mm and the height of the protrusions 32a and 34a and the protrusions 33b and 35b is 0.10 mm. Tip portions of the protrusions 32a through 35a and the protrusions 32b through 35b near to and distant from the centerline CL of the metal base plate 30 are in contact with the back surfaces of semiconductor units 20a and 20b respectively. FIG. 7 simply illustrates the protrusions 32a and 33a and the protrusions 32b and 33b. The same applies to the protrusions 34a and 35a and the protrusions 34b and 35b. End portions of solder 25a and solder 25b distant from the centerline CL (central portion) of the metal base plate 30 are thicker than end portions of the solder 25a and the solder 25b near to the centerline CL. The thickness of edge portions of the solder 25a and the solder 25b may be the thickness of the solder 25a and the solder 25b formed between the back surfaces of end portions of metal plates 23 of the ceramic circuit boards 21 and the front surface of a radiation plate 31 except the protrusions 32a through 35a and 32b through 35b of the metal base plate 30. That is to say, the semiconductor units 20a and 20b are inclined so that edge portions of the semiconductor units 20a and 20b near to the centerline CL of the metal base plate 30 will be lower than edge portions of the semiconductor units 20a and 20b distant from the centerline CL. The semiconductor units 20a and 20b are bonded in this state with the solder 25a and the solder 25b respectively. In addition, the amount of the end portions distant from the centerline CL (central portion) of the solder 25a and the solder 25b which project from the end portions of the metal plates 23 on the front surface of the metal base plate 30 is larger than the amount of the end portions near to the centerline CL of the solder 25a and the solder 25b which project from the end portions of the metal plate 23. Accordingly, fillets of the end portions of the solder 25a and the solder 25b distant from the centerline CL of the metal base plate 30 are greater than fillets of the end portions of the solder 25a and the solder 25b near to the centerline CL. Moreover, with the semiconductor device 10a, the protrusions 32a and 34a may be linked to form a convex shape along a side of the ceramic circuit board 21. Similarly, the protrusions 33b and 35b, the protrusions 33a and 35a, or the protrusions 32b and 34b may be linked to form a convex shape along a side of the ceramic circuit board 21. Furthermore, the height of the linked protrusions 33a and 35a is greater than that of the linked protrusions 32a and 34a. The same applies to the protrusions 32b through 35b.

Figure 8:
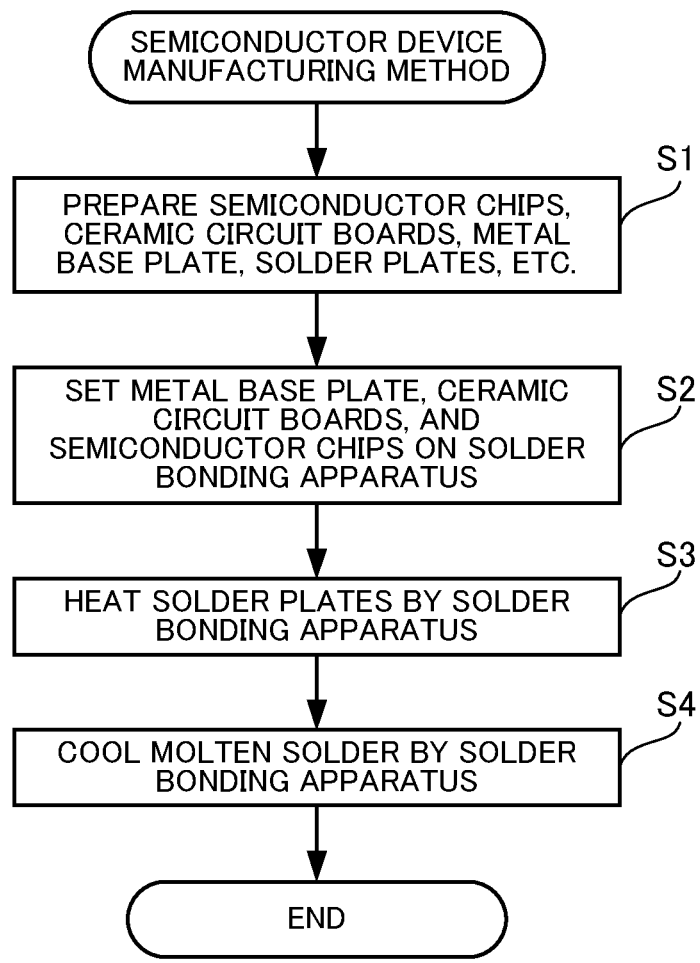
FIG. 8 is a flow chart illustrative of a method for manufacturing the second semiconductor device.
Figure 9:
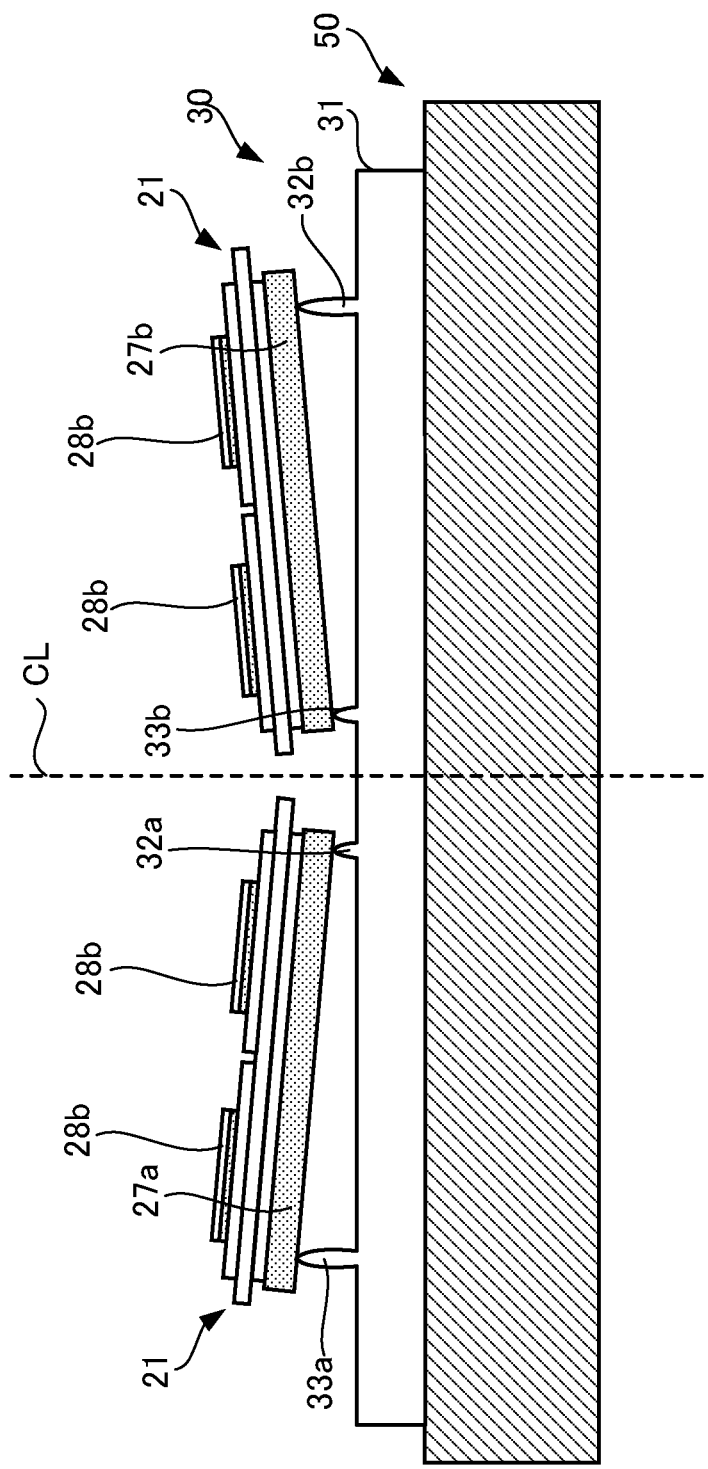
FIG. 9 is a view for describing setting on a solder bonding apparatus in the method for manufacturing the second semiconductor device.

In addition, a method for manufacturing the above semiconductor device 10a will be described with reference to FIGS. 8 and 9. FIG. 8 is a flow chart illustrative of a method for manufacturing the second semiconductor device. FIG. 9 is a view for describing setting on a solder bonding apparatus in the method for manufacturing the second semiconductor device. Detailed descriptions of processes of the flow chart of FIG. 8 which are the same as those of the flow chart of FIG. 3 will be simplified or omitted. Furthermore, FIG. 9 is also a sectional view taken along the dot-dash line X-X of FIG. 1 and corresponds to FIG. 4 in the first embodiment.

First, components, such as semiconductor chips 28a and 28b, the ceramic circuit boards 21, the metal base plate 30, and solder plates, of the semiconductor device 10a are prepared (step S1). This is the same with the first embodiment. The metal base plate 30 illustrated in FIG. 7 is prepared. That is to say, the metal base plate 30 on whose disposition areas 36a and 36b the protrusions 33a and 35a and the protrusions 32b and 34b distant from the centerline CL and higher than the protrusions 32a and 34a and the protrusions 33b and 35b near to the centerline CL and the protrusions 32a and 34a and the protrusions 33b and 35b are formed in advance is prepared.

Next, the metal base plate 30 is set on a determined area of a solder bonding apparatus 50. In this case, a central portion of the metal base plate 30 may also be slightly warped and upward convex. That is to say, the central portion of the metal base plate 30 may protrude above the short sides and the long sides of the metal base plate 30 and be warped. Solder plates 27a and 27b are set so as to be supported on the protrusions 32a through 35a and the protrusions 32b through 35b formed on the disposition areas 36a and 36b, respectively, of the metal base plate 30. The solder plates 27a and 27b are supported on the protrusions 32a through 35a and the protrusions 32b through 35b which differ in height. As a result, the centerline CL side is lower than the outside distant from the centerline CL and the solder plates 27a and 27b are inclined. As illustrated in FIG. 9, the ceramic circuit boards 21 are set on the solder plates 27a and 27b and the semiconductor chips 28a and 28b are set on circuit patterns 24b and 24c of the ceramic circuit boards 21 with solder plates (not illustrated) therebetween (step S2).

In steps S3 and S4, the same processes performed in steps S4 and s5, respectively, of the flow chart of FIG. 3 are performed. That is to say, the solder bonding apparatus 50 is driven and the solder plates 27a and 27b are heated via the back surface of the metal base plate 30 (step S3). As a result, the metal base plate 30 warps, so that its central portion is downward convex. Furthermore, molten solder 27a1 and molten solder 27b1 into which the solder plates 27a and 27b are melted spread between the back surfaces of the ceramic circuit boards 21 and the disposition areas 36a and 36b respectively. In this case, a resist member may also be applied to the outside of sides distant from the centerline CL of the disposition areas 36a and 36b parallel to the centerline CL in order to prevent the molten solder 27a1 and the molten solder 27b1 from excessively spreading.

In addition, if the protrusions 33a and 35a and the protrusions 32b and 34b are higher than the protrusions 32a and 34a and the protrusions 33b and 35b by, for example, 100 μm or more, then the molten solder 27a1 and the molten solder 27b1 at end portions of the ceramic circuit boards 21 distant from the centerline CL of the metal base plate 30 may become thinner than the molten solder 27a1 and the molten solder 27b1 at end portions of the ceramic circuit boards 21 near to the centerline CL. On the other hand, there is a possibility that if the protrusions 33a and 35a and the protrusions 32b and 34b are sufficiently higher than the protrusions 32a and 34a and the protrusions 33b and 35b, end portions of the ceramic circuit boards 21 distant from the centerline CL are not filled with the molten solder 27a1 and the molten solder 27b1. In this case, the whole of the end portions of the ceramic circuit boards 21 distant from the centerline CL are not supported on fillets of the solder 25a and the solder 25b obtained in the following process by solidifying the molten solder 27a1 and the molten solder 27b1. On the other hand, if the protrusions 33a and 35a and the protrusions 32b and 34b are higher than the protrusions 32a and 34a and the protrusions 33b and 35b by about 100 μm, then the end portions of the ceramic circuit boards 21 distant from the centerline CL are reliably filled with the molten solder 27a1 and the molten solder 27b1. As a result, the end portions of the molten solder 27a1 and the molten solder 27b1 distant from the centerline CL of the metal base plate 30 are thicker than the end portions of the molten solder 27a1 and the molten solder 27b1 near to the centerline CL.

Next, the molten solder 27a1 and the molten solder 27b1 into which the solder plates 27a and 27b are melted are cooled (step S4). The molten solder 27a1 and the molten solder 27b1 are cooled in this way and are solidified to form the solder 25a and the solder 25b respectively. The semiconductor device 10a is taken out of the solder bonding apparatus 50. As a result, the ceramic circuit boards 21 are adhered to the metal base plate 30 and the semiconductor device 10a is obtained.

As stated above, with the semiconductor device 10a, the ceramic circuit boards 21 are located over the protrusions 32a, 34a, 33b, and 35b and the protrusions 33a, 35a, 32b, and 34b higher than the protrusions 32a, 34a, 33b, and 35b which are formed on the disposition areas 36a and 36b of the metal base plate 30 with the solder plates 27a and 27b therebetween. The solder plates 27a and 27b are melted to bond the ceramic circuit boards 21 to the disposition areas 36a and 36b. By doing so, the edge portions distant from the centerline CL of the molten solder 27a1 and the molten solder 27b1 become thicker than the edge portions near to the centerline CL of the molten solder 27a1 and the molten solder 27b1. Accordingly, as outer areas of the molten solder 27a1 and the molten solder 27b1 shrink, they are able to compensate for a shrinkage in the volume. This suppresses the formation of a shrinkage cavity. Compared with the first embodiment, a pressing process (using the weights 41a and 41b) is not needed. This reduces the production costs. Moreover, with the semiconductor device 10a, the protrusions 32a, 34a, 33b, and 35b and the protrusions 33a, 35a, 32b, and 34b higher than the protrusions 32a, 34a, 33b, and 35b are used. Accordingly, the end portions distant from the centerline CL of the solder 25a and the solder 25b become thicker than the end portions near to the centerline CL of the solder 25a and the solder 25b. As a result, fillets in which an end portion distant from the centerline CL is thicker than an end portion near to the centerline CL are reliably formed compared with the first embodiment.

The semiconductor device 10a manufactured in this way includes the metal base plate 30 on whose front surface the disposition areas 36a and 36b are set apart from the centerline CL and the ceramic circuit boards 21 located over the disposition areas 36a and 36b with the solder 25a and the solder 25b, respectively, therebetween. In this case, the edge portions distant from the centerline CL of the solder 25a and the solder 25b are thicker than the edge portions near to the centerline CL of the solder 25a and the solder 25b. The formation of a shrinkage cavity is suppressed in outer areas of the solder 25a and the solder 25b. This manufacturing method suppresses an increase in the amount of the solder 25a and the solder 25b and an increase in the thermal resistance of the solder 25a and the solder 25b and prevents deterioration in the heat dissipation property of the semiconductor device 10a. Furthermore, the back surfaces of the semiconductor units 20a and 20b are supported on the protrusions 32a through 35a and the protrusions 32b through 35b respectively. Accordingly, the solder 25a and the solder 25b have high adhesion to the metal base plate 30 compared with the first embodiment. Bondability between the metal base plate 30 and the semiconductor units 20a and 20b is improved. As a result, with the semiconductor device 10a, deterioration in reliability is suppressed and stable operation is realized.

Third Embodiment

A semiconductor device 10b according to a third embodiment will be described with reference to FIGS. 10 and 11.

Figure 10:
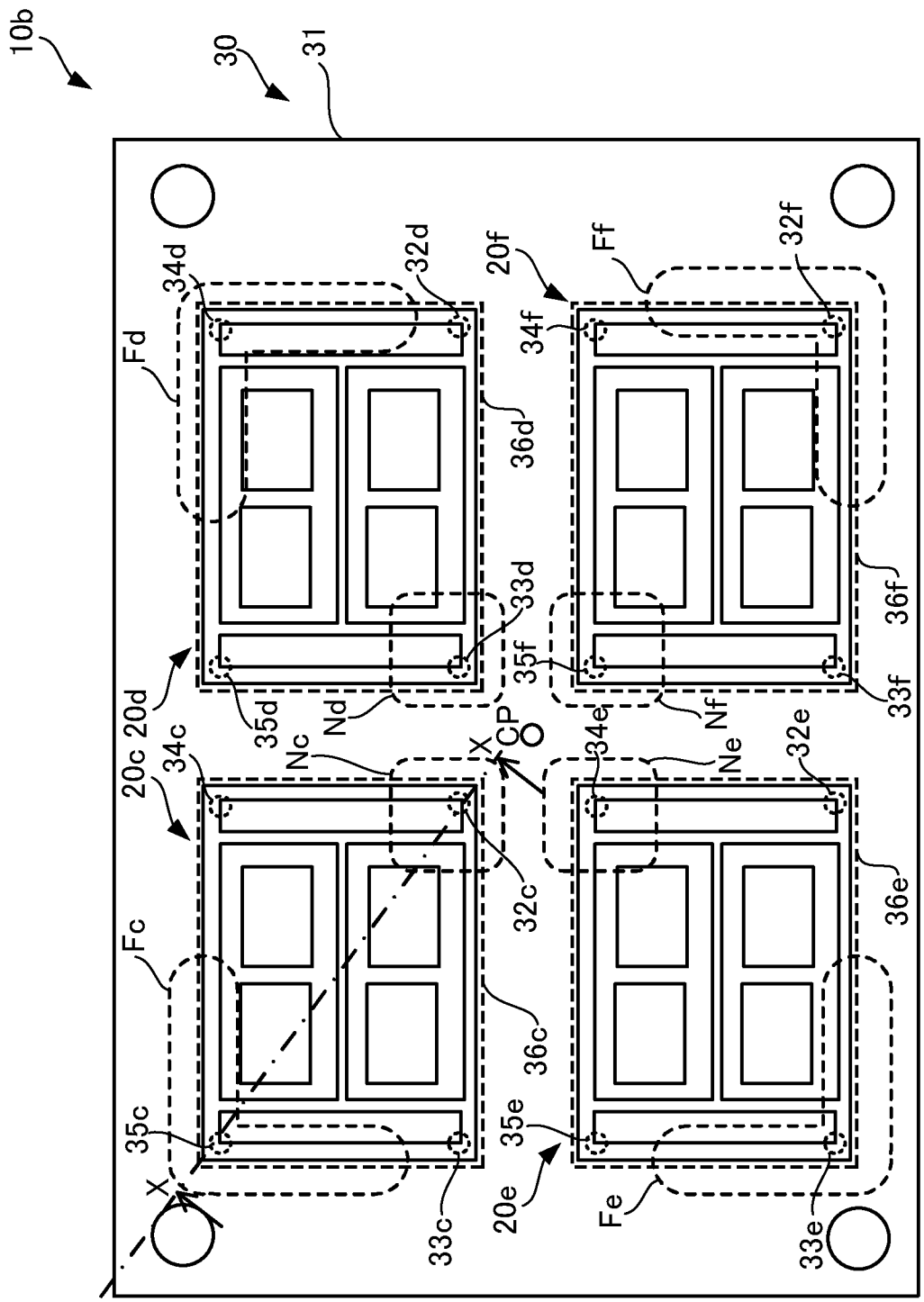
FIG. 10 is a plan view of a semiconductor device according to a third embodiment.
Figure 11:
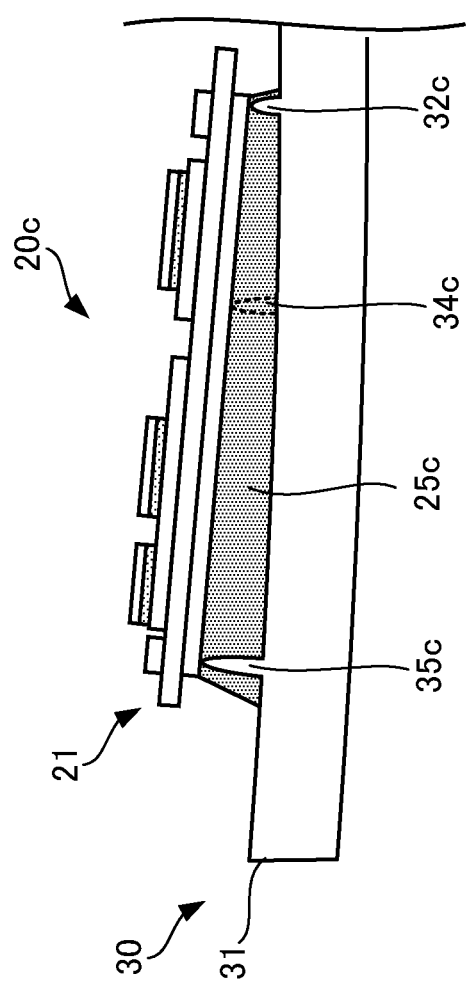
FIG. 11 is a sectional view of the semiconductor device according to the third embodiment.

FIG. 10 is a plan view of a semiconductor device according to a third embodiment. FIG. 11 is a sectional view of the semiconductor device according to the third embodiment. FIG. 11 is a sectional view taken along the dot-dash line X-X of FIG. 10. In addition, components of the semiconductor device 10b which are the same as those of the semiconductor device 10 according to the first embodiment or the semiconductor device 10a according to the second embodiment are marked with the same reference numerals and description of them will be simplified or omitted.

The semiconductor device 10b includes four semiconductor units 20c, 20d, 20e, and 20f and a metal base plate 30 over which the semiconductor units 20c, 20d, 20e, and 20f are located with solder therebetween (semiconductor unit 20c is located with solder 25c therebetween). Hereinafter the semiconductor units 20c, 20d, 20e, and 20f will be described as the semiconductor units 20 if no special distinction is made between the semiconductor units 20c, 20d, 20e, and 20f.

The metal base plate 30 includes a radiation plate 31 and protrusions 32c through 35c, 32d through 35d, 32e through 35e, and 32f through 35f formed on the front surface of the radiation plate 31. In FIG. 10, positions at which the protrusions 32c through 35c, 32d through 35d, 32e through 35e, and 32f through 35f are formed are indicated by dashed lines.

Disposition areas 36c, 36d, 36e, and 36f are set on the radiation plate 31, are rectangular in plan view, and are symmetrical with a central portion CP as a center. Specifically, the disposition areas 36c and 36f are symmetrical with respect to the central portion CP.

The disposition areas 36d and 36e are symmetrical with respect to the central portion CP. Furthermore, the disposition areas 36c and 36d or the disposition areas 36e and 36f are symmetrical with respect to a straight line (not illustrated) passing through the central portion CP and parallel to the short sides. In addition, the disposition areas 36c and 36e or the disposition areas 36d and 36f are symmetrical with respect to a straight line (not illustrated) passing through the central portion CP and parallel to the long sides.

The protrusions 32c through 35c, 32d through 35d, 32e through 35e, and 32f through 35f are integrally formed with the radiation plate 31 on corner portions of the disposition areas 36c, 36d, 36e, and 36f respectively. Of the protrusions 32c through 35c, 32d through 35d, 32e through 35e, and 32f through 35f, protrusions distant from the central portion CP are higher than protrusions near to the central portion CP. For example, the case of the disposition area 36c will be described. As illustrated in FIG. 11, the protrusion 32c, of the protrusions 32c through 35c, nearest to the central portion CP is the lowest and the protrusion 35c most distant from the central portion CP is the highest. The height of the protrusions 33c and 34c (protrusion 33c is not illustrated in FIG. 11) is between the height of the protrusion 32c and the height of the protrusion 35c. In FIG. 11, the position of the protrusion 34c is indicated by a dashed line. The protrusions 32c through 35c are formed in this way. A ceramic circuit board 21 is located over the disposition area 36c with solder 25c therebetween in accordance with the flow chart of FIG. 8. By doing so, an end portion of the solder 25c distant from the central portion CP becomes thicker than an end portion of the solder 25c near to the central portion CP. The thickness of an end portion of the solder 25c may be the thickness of the solder 25c formed between the back surface of an end portion of a metal plate 23 of the ceramic circuit board 21 and the front surface of the radiation plate 31 except the protrusions 32c through 35c of the metal base plate 30. In this case, as illustrated in FIG. 10, the solder 25c under an area Fc of the semiconductor unit 20c enclosed by a dashed line is thicker than the solder 25c near to the central portion CP and under an area Nc of the semiconductor unit 20c enclosed by a dashed line. Similarly, the protrusion 32d, of the protrusions 32d through 35d on the disposition area 36d, nearest to the central portion CP is the lowest and the protrusion 35d most distant from the central portion CP is the highest. The protrusion 32e, of the protrusions 32e through 35e on the disposition area 36e, nearest to the central portion CP is the lowest and the protrusion 35e most distant from the central portion CP is the highest. The protrusion 32f, of the protrusions 32f through 35f on the disposition area 36f, nearest to the central portion CP is the lowest and the protrusion 35f most distant from the central portion CP is the highest. The height of the protrusions 33d and 34d is between the height of the protrusion 32d and the height of the protrusion 35d. The height of the protrusions 33e and 34e is between the height of the protrusion 32e and the height of the protrusion 35e. The height of the protrusions 33f and 34f is between the height of the protrusion 32f and the height of the protrusion 35f. A ceramic circuit board 21 is located over each of the disposition areas 36d, 36e, and 36f with solder (not illustrated) therebetween in accordance with the flow chart of FIG. 8. By doing so, an end portion of the solder distant from the central portion CP becomes thicker than an end portion of the solder near to the central portion CP. In these cases, as illustrated in FIG. 10, the solder under areas Fd, Fe, and Ff of the semiconductor unit 20d, 20e, and 20f enclosed by dashed lines is thicker than the solder near to the central portion CP and under areas Nd, Ne, and Nf of the semiconductor units 20d, 20e, and 20f, respectively, enclosed by dashed lines. Moreover, the amount of an end portion distant from the central portion CP of solder which projects from an end portion of a metal plate 23 on the front surface of the metal base plate 30 is larger than the amount of an end portion near to the central portion CP of the solder which projects from an end portion of the metal plate 23. Accordingly, a fillet of the end portion of the solder distant from the central portion CP of the metal base plate 30 is greater than a fillet of the end portion of the solder near to the central portion CP. Hereinafter the solder with which the semiconductor units 20c, 20d, 20e, and 20f are bonded to the metal base plate 30 will be simply described as the solder.

The above semiconductor device 10b includes the metal base plate 30 on whose front surface the disposition areas 36c, 36d, 36e, and 36f are set apart from the central portion CP and the ceramic circuit boards 21 located over the disposition areas 36c, 36d, 36e, and 36f with the solder therebetween. In this case, the edge portions distant from central portion CP of the solder are thicker than the edge portions near to the central portion CP of the solder. The formation of a shrinkage cavity is suppressed in outer areas of the solder. This manufacturing method suppresses an increase in the amount of the solder and an increase in the thermal resistance of the solder and prevents deterioration in the heat dissipation property of the semiconductor device 10b. Accordingly, with the semiconductor device 10b, deterioration in reliability is suppressed and stable operation is realized.

If all of the protrusions 32c through 35c, 32d through 35d, 32e through 35e, and 32f through 35f in the semiconductor device 10b are equal in height, then the semiconductor device 10b is manufactured in accordance with the flow chart of FIG. 3. In this case, a weight is set in step S3 on each of the areas Nc, Nd, Ne, and Nf illustrated in FIG. 10. Alternatively, one weight may be set on the areas Nc, Nd, Ne, and Nf illustrated in FIG. 10. As a result, the back surfaces of the ceramic circuit boards 21 are supported on the protrusions 32c, 33d, 34e, and 35f nearest to the central portion CP. Furthermore, there are gaps between the back surfaces of the ceramic circuit boards 21 and tip portions of the protrusions 35c, 34d, 33e, and 32f most distant from the central portion CP. The back surfaces of the ceramic circuit boards 21 are located apart from the tip portions of the protrusions 35c, 34d, 33e, and 32f.

Fourth Embodiment

Figure 12:
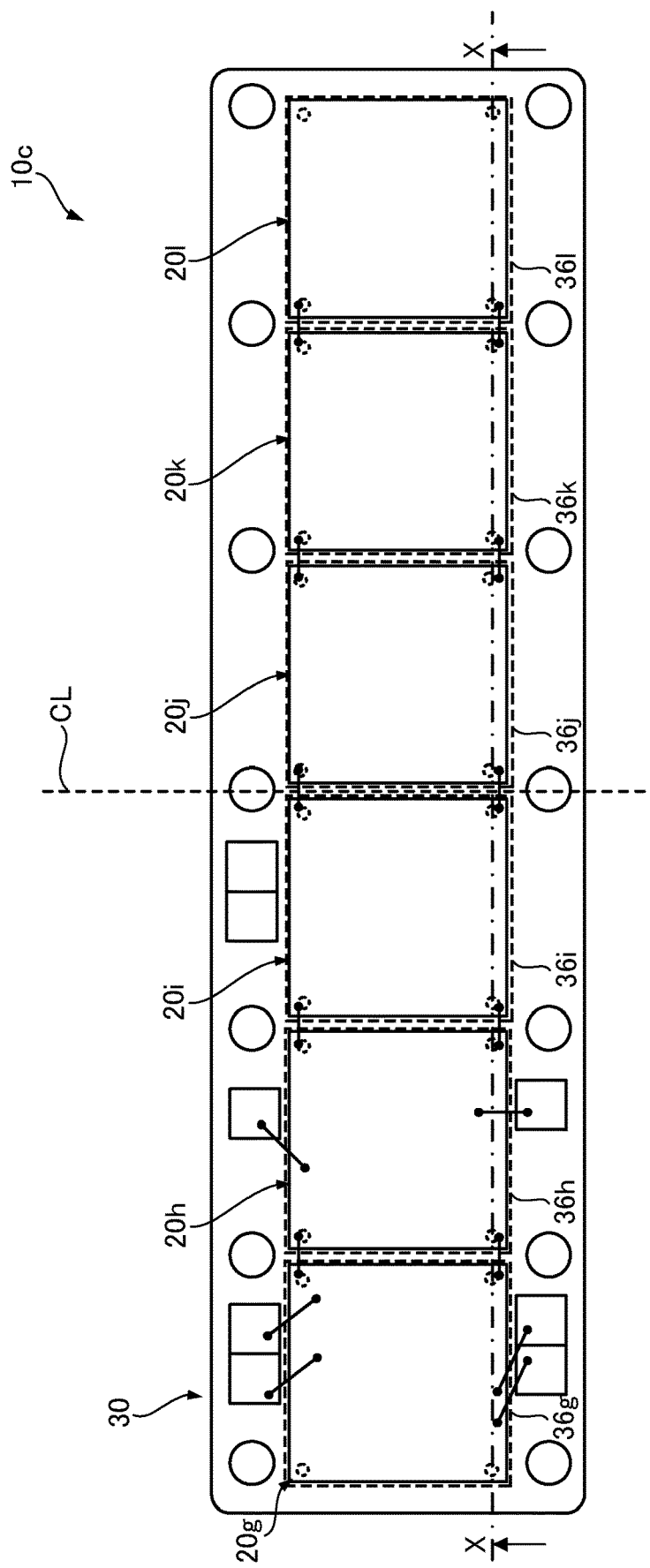
FIG. 12 is a plan view of a semiconductor device according to a fourth embodiment.
Figure 13:
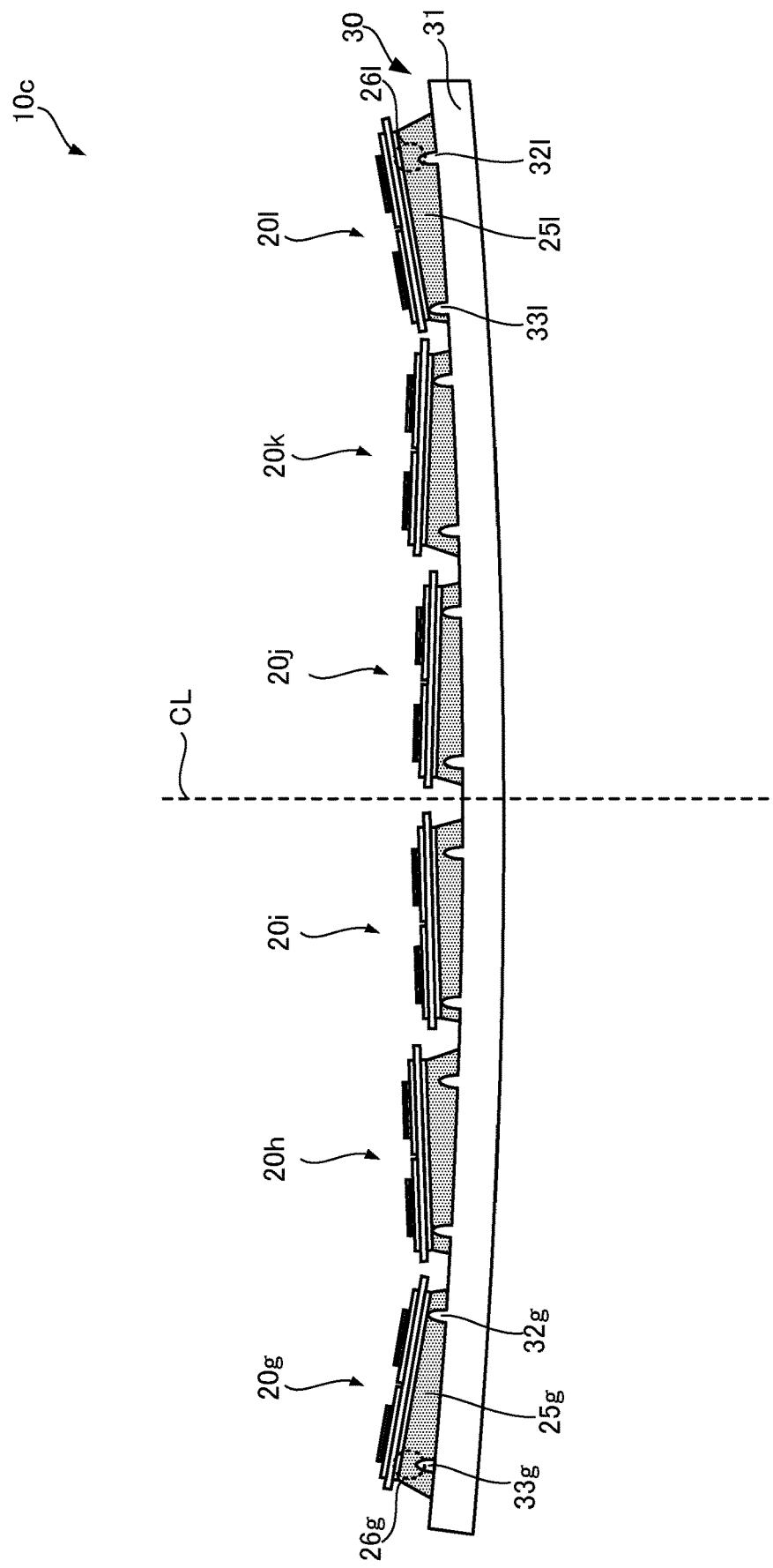
FIG. 13 is a sectional view of the semiconductor device according to the fourth embodiment.

In a fourth embodiment, a case where a plurality of semiconductor units are disposed in a line over a metal base plate will be described with reference to FIGS. 12 and 13. FIG. 12 is a plan view of a semiconductor device according to a fourth embodiment. FIG. 13 is a sectional view of the semiconductor device according to the fourth embodiment. FIG. 13 is a sectional view taken along the dot-dash line X-X of FIG. 12. In the fourth embodiment, components which are the same as those described in the first through third embodiments are also marked with the same reference numerals and description of them will be simplified or omitted. Furthermore, the structure of semiconductor units 20g, 20h, 20i, 20j, 20k, and 20l is the same as that of the semiconductor units 20. Accordingly, in FIGS. 12 and 13, a reference numeral of each component of the semiconductor units 20g, 20h, 20i, 20j, 20k, and 20l is omitted. Furthermore, in FIG. 12 the disposition of the semiconductor units 20g, 20h, 20i, 20j, 20k, and 20l is indicated by squares. In addition, in FIG. the positions of protrusions are indicated by dashed lines and their reference numerals are omitted.

A semiconductor device 10c includes the semiconductor units 20g, 20h, 20i, 20j, 20k, and 20l and a metal base plate 30 over which the semiconductor units 20g, 20h, 20i, 20j, 20k, and 20l are disposed. The semiconductor units 20g, 20h, 20i, 20j, 20k, and 20l are properly connected electrically by bonding wires. Furthermore, electronic parts are disposed over the metal base plate 30. The electronic parts are properly connected electrically to the semiconductor units 20g, 20h, 20i, 20j, 20k, and 20l by bonding wires. Disposition areas 36g, 36h, and 36i and disposition areas 36j, 36k, and 36l are set in a line on the metal base plate 30 with a centerline CL therebetween. The semiconductor units 20g, 20h, 20i, 20j, 20k, and 20l are disposed over the disposition areas 36g, 36h, 36i, 36j, 36k, and 36l, respectively, with solder therebetween. Furthermore, protrusions which are equal in height are integrally formed with a radiation plate 31 on corner portions of the disposition areas 36g, 36h, 36i, 36j, 36k, and 36l. This is the same with the first embodiment.

As illustrated in FIG. 13, with the semiconductor units 20g and 20l (ceramic circuit boards 21) most distant from the centerline CL (central portion) of the metal base plate 30, end portions of solder 25g and solder 25l distant from the centerline CL (central portion) of the metal base plate 30 are thicker than end portions of the solder 25g and the solder 25l near to the centerline CL. The thickness of edge portions of the solder 25g and the solder 25l may be the thickness of the solder 25g and the solder 25l formed between the back surfaces of end portions of metal plates 23 of the ceramic circuit boards 21 and the front surface of the radiation plate 31 except the protrusions 32g, 33g, 321, and 331 of the metal base plate 30. Furthermore, the amount of the end portions distant from the centerline CL (central portion) of the solder 25g and the solder 25l which project from the end portions of the metal plates 23 on the front surface of the metal base plate 30 is larger than the amount of the end portions near to the centerline CL of the solder 25g and the solder 25l which project from the end portions of the metal plate 23. Accordingly, fillets of the end portions of the solder 25g and the solder 25l distant from the centerline CL of the metal base plate 30 are greater than fillets of the end portions of the solder 25g and the solder 25l near to the centerline CL. In addition, tip portions of the protrusions 32g and 33l near to the centerline CL of the metal base plate 30 are in contact with the back surfaces of the semiconductor units 20g and 20l (ceramic circuit boards 21) respectively. On the other hand, there are gaps 26g and 26l between the back surfaces of the semiconductor units 20g and 20l (ceramic circuit boards 21) and the protrusions 33g and 32l most distant from the centerline CL. That is to say, the back surfaces of the semiconductor units 20g and 20l are located apart from the protrusions 33g and 32l.

Furthermore, as illustrated in FIG. 13, with each of the semiconductor units 20h through 20k other than the semiconductor units 20g and 20l most distant from the centerline CL (central portion) of the metal base plate 30, that is to say, with each of the semiconductor units 20h through 20k situated inside the semiconductor units 20g and 20l, an end portion of solder distant from the centerline CL (central portion) of the metal base plate 30 may be thinner than an end portion of the solder near to the centerline CL. In addition, the amount of an end portion distant from the centerline CL (central portion) of solder which projects from an end portion of the metal plate 23 on the front surface of the metal base plate 30 may be smaller than the amount of an end portion near to the centerline CL of the solder which projects from an end portion of the metal plate 23. Accordingly, a fillet of the end portion of the solder distant from the centerline CL of the metal base plate 30 may be smaller than a fillet of the end portion of the solder near to the centerline CL. Moreover, there may be gaps between the back surfaces of the semiconductor units 20h through 20k and tip portions of the protrusions near to the centerline CL of the metal base plate 30. That is to say, the back surfaces of the semiconductor units 20h through 20k may be located apart from the tip portions of the protrusions. On the other hand, the back surfaces of the semiconductor units 20h through 20k are in contact with the protrusions distant from the centerline CL.

The above semiconductor device 10c is manufactured in accordance with the flow chart of FIG. 3. In this case, weights are set in step S3 on end portions near to the centerline CL of the (outmost) semiconductor units 20g and 20l (ceramic circuit boards 21) most distant from the centerline CL of the metal base plate 30. The weights used at this time may be equal in shape and material to the weights in the first embodiment.

After that, the metal base plate 30 is disposed on a solder bonding apparatus 50 in step S4. Heat is conducted from the central portion (centerline CL) to outer portions of the metal base plate 30. Accordingly, solder plates at end portions distant from the centerline CL of the (outmost) semiconductor units 20g and 20l (ceramic circuit boards 21) most distant from the centerline CL of the metal base plate 30 are melted last. Furthermore, in step S5, the solder bonding apparatus 50 is stopped and molten solder into which the solder plates are melted is cooled. At this time, the metal base plate 30 is also cooled from the central portion (centerline CL) to outer edge portions. As stated above, when the molten solder is cooled, outer areas cooled last cohere and their volume shrinks. Accordingly, a shrinkage cavity is apt to be formed in the end portions distant from the centerline CL of the solder of the outmost semiconductor units 20g and 20l, of the semiconductor units 20g, 20h, 20i, 20j, 20k, and 20l. Therefore, when the semiconductor device 10c is manufactured, the weights are set on end portions near to the centerline CL of the ceramic circuit boards 21 disposed over the outmost disposition areas 36g and 36l of the metal base plate 30 on which the disposition areas 36g, 36h, 36i, 36j, 36k, and 36l are set. As illustrated in FIG. 13, with the semiconductor device 10c manufactured in this way, the end portions distant from the centerline CL of the solder 25g and the solder 25l of the semiconductor units 20g and 20l most distant from the centerline CL are thicker than the end portions near to the centerline CL of the solder 25g and the solder 25l. The formation of a shrinkage cavity is suppressed in outer areas of the solder 25g and the solder 25l. This suppresses an increase in the amount of the solder 25g and the solder 25l and an increase in the thermal resistance of the solder 25g and the solder 25l and prevents deterioration in the heat dissipation property of the semiconductor device 10c. Accordingly, with the semiconductor device 10c, deterioration in reliability is suppressed and stable operation is realized.

Furthermore, with the semiconductor device 10c, the semiconductor units 20g and 20l most distant from the centerline CL (central portion) of the metal base plate 30 may be located on the protrusions 32a and 33a and the protrusions 32b and 33b, respectively, described in the second embodiment and illustrated in FIG. 7. In this case, the protrusions 33g and 32l distant from the centerline CL are higher than the protrusions 32g and 33l near to the centerline CL. Tip portions of the protrusions 33g and 32l distant from the centerline CL of the metal base plate 30 and tip portions of the protrusions 32g and 33l near to the centerline CL are in contact with the back surfaces of the semiconductor units 20g and 20l.

In this case, the semiconductor device 10c is manufactured in accordance with the flow chart of FIG. 8. At this time, protrusions (protrusions 33g and 32l in FIG. 13) distant from the centerline CL on the outmost disposition areas 36g and 36l, of the disposition areas 36g, 36h, 36i, 36j, 36k, and 36l of the metal base plate 30, are made higher than protrusions (protrusions 32g and 33l in FIG. 13) near to the centerline CL. By doing so, as the solder 25g and the solder 25l illustrated in FIG. 13, end portions distant from the centerline CL become thicker than end portions near to the centerline CL. In this case, the formation of a shrinkage cavity is also suppressed in the outer areas of the solder 25g and the solder 25l. This suppresses an increase in the amount of the solder 25g and the solder 25l and an increase in the thermal resistance of the solder 25g and the solder 25l and prevents deterioration in the heat dissipation property of the semiconductor device 10c. Accordingly, with the semiconductor device 10c, deterioration in reliability is suppressed and stable operation is realized.

Furthermore, when the fourth embodiment is taken into account, it is desirable that if four or more semiconductor units 20 are located in a line over the metal base plate 30, end portions of solder distant from the centerline CL of the metal base plate 30 be made thicker than end portions of the solder near to the centerline CL in at least the outmost semiconductor units 20. In addition, with the third embodiment, it is desirable in view of the fourth embodiment that if three or more semiconductor units 20 are located in length and width over the metal base plate 30, end portions of solder distant from the central portion of the metal base plate 30 be made thicker than end portions of the solder near to the central portion in at least the outmost semiconductor units 20 of the semiconductor units 20 located in length and width.

According to the disclosed technique, solder thickness which is able to keep a certain heat dissipation property is maintained and stable operation is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a metal base plate having a front surface on which a disposition area is set apart from a central portion of the metal base plate; and
   a board placed over the disposition area with a solder therebetween, the solder having two edge portions, opposed to each other with respect to the central portion, of which one is farther than the other to the central portion of the metal base plate, said one being thicker than said the other, wherein
   the board has two edge portions, opposed to each other with respect to the central portion, of which one is farther than the other to the central portion of the metal base plate, the board being inclined so that the one edge portion thereof being higher than the other edge portion thereof in a side view of the semiconductor device.

2. The semiconductor device according to claim 1, wherein the central portion of the metal base plate is convexly warped to protrude to a side opposite to the front surface.

3. The semiconductor device according to claim 1, further comprising:
   a first protrusion formed at a first formation position on the disposition area, and
   a second protrusion formed at a second formation position on the disposition area, the second formation position being farther from the central portion than the first formation position.

4. A semiconductor device comprising:
   a metal base plate having a front surface on which a disposition area is set apart from a central portion of the metal base plate;
   a board placed over the disposition area with a solder therebetween, the solder having two edge portions of which one is farther than the other to the central portion of the metal base plate, said one being thicker than said the other;
   a first protrusion formed at a first formation position on the disposition area; and
   a second protrusion formed at a second formation position on the disposition area, the second formation position being farther from the central portion than the first formation position, wherein:
   the first protrusion is in contact with a back surface of the board; and
   the second protrusion is longer than the first protrusion, and is in contact with the back surface of the board.

5. The semiconductor device according to claim 1, wherein:
   the disposition area is provided in plurality;
   the disposition areas set on the metal base plate are symmetrical with respect to the central portion of the metal base plate;
   the board is provided in plurality; and
   the boards are respectively placed over the disposition areas.

6. The semiconductor device according to claim 1, wherein:
   the disposition area is provided in plurality;
   the board is provided in plurality;
   the solder is provided in plurality;
   the disposition areas are set on the metal base plate in a determined direction;
   the boards are placed over the disposition areas with the solders therebetween, respectively; and
   the solder in each outmost disposition area of the disposition areas has two end portions, of which one is farther than the other from the central portion of the metal base plate in the determined direction, said one being thicker than said the other.

* * * * *